(12) United States Patent
Embleton et al.

(10) Patent No.: US 11,586,262 B2
(45) Date of Patent: Feb. 21, 2023

(54) SYSTEM AND METHOD FOR SERVICE LIFE MANAGEMENT BASED ON CONDENSATION REMOVAL

(71) Applicant: Dell Products L.P., Hopkinton, MA (US)

(72) Inventors: Steven Embleton, Austin, TX (US); Jon Taylor Fitch, Austin, TX (US); Sandor T. Farkas, Round Rock, TX (US); Joseph Danny King, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 406 days.

(21) Appl. No.: 16/938,453

(22) Filed: Jul. 24, 2020

(65) Prior Publication Data
US 2022/0026968 A1    Jan. 27, 2022

(51) Int. Cl.
*H05K 7/20*       (2006.01)
*G06F 1/20*       (2006.01)
(Continued)

(52) U.S. Cl.
CPC ......... *G06F 1/206* (2013.01); *G05B 19/0428* (2013.01); *H05K 7/20309* (2013.01);
(Continued)

(58) Field of Classification Search
CPC .................................... G06F 1/20; H05K 7/20
See application file for complete search history.

(56) References Cited

U.S. PATENT DOCUMENTS

2006/0056106 A1 * 3/2006 Murakami ............. G11B 33/14
                                                    360/97.12
2020/0327911 A1 * 10/2020 Zhang ..................... C08L 27/18

FOREIGN PATENT DOCUMENTS

CN           107329553 A   * 11/2017
CN           213694667 U   *  7/2021
(Continued)

OTHER PUBLICATIONS

"OnGuard Smart"; Purafil, Inc.; 2017 (https://www.purafil.com/products/monitoring/active-monitoring/onguard-smart/).

*Primary Examiner* — Mark A Connolly
(74) *Attorney, Agent, or Firm* — Chamberlain, Hrdlicka, White, Williams & Aughtry

(57) ABSTRACT

A method for environmentally managing a computing device of an information handling system includes monitoring an environmental corrosion risk associated with a component of the computing device, a corrosion management component that reduces a rate of corrosion of the component due to an ambient environment in which the component resides by removing condensation from the component is associated with the component; making a determination that the component is associated with the corrosion management component; in response to the determination: estimating a corrosion risk of the component based on: the environmental corrosion risk, and a risk reduction factor associated with the corrosion management component; making a second determination that the corrosion risk of the component indicates a premature failure of the component; and remediating, in response to the second determination, the corrosion risk of the component.

20 Claims, 9 Drawing Sheets

(51) Int. Cl.
*G05B 19/042* (2006.01)
*G01N 17/04* (2006.01)
(52) U.S. Cl.
CPC ..... *H05K 7/20318* (2013.01); *H05K 7/20381* (2013.01); *G01N 17/04* (2013.01); *G05B 2219/24015* (2013.01)

(56) References Cited

FOREIGN PATENT DOCUMENTS

| CN | 114415807 A | * | 4/2022 |
| CN | 217504031 U | * | 9/2022 |

* cited by examiner

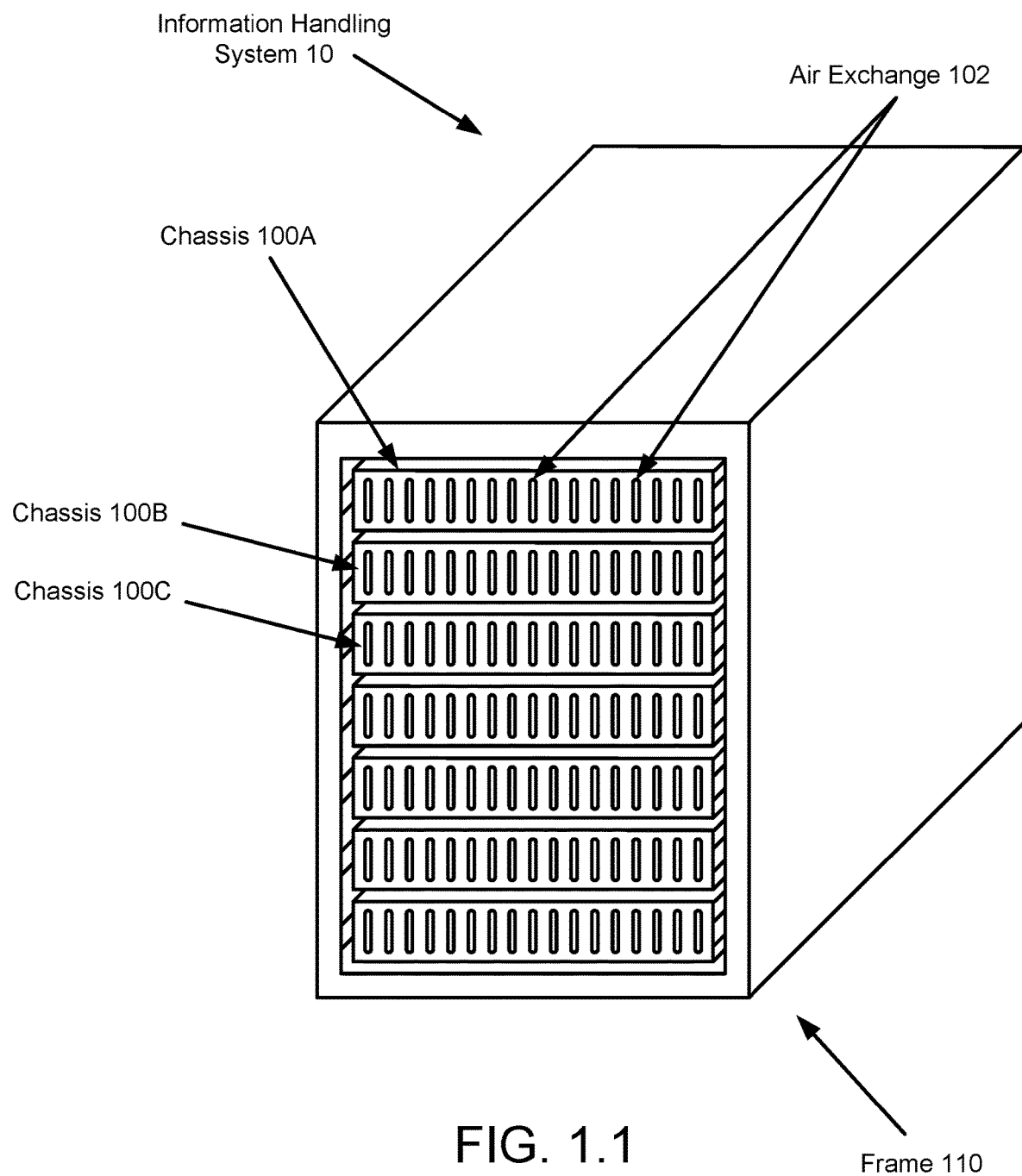
FIG. 1.1

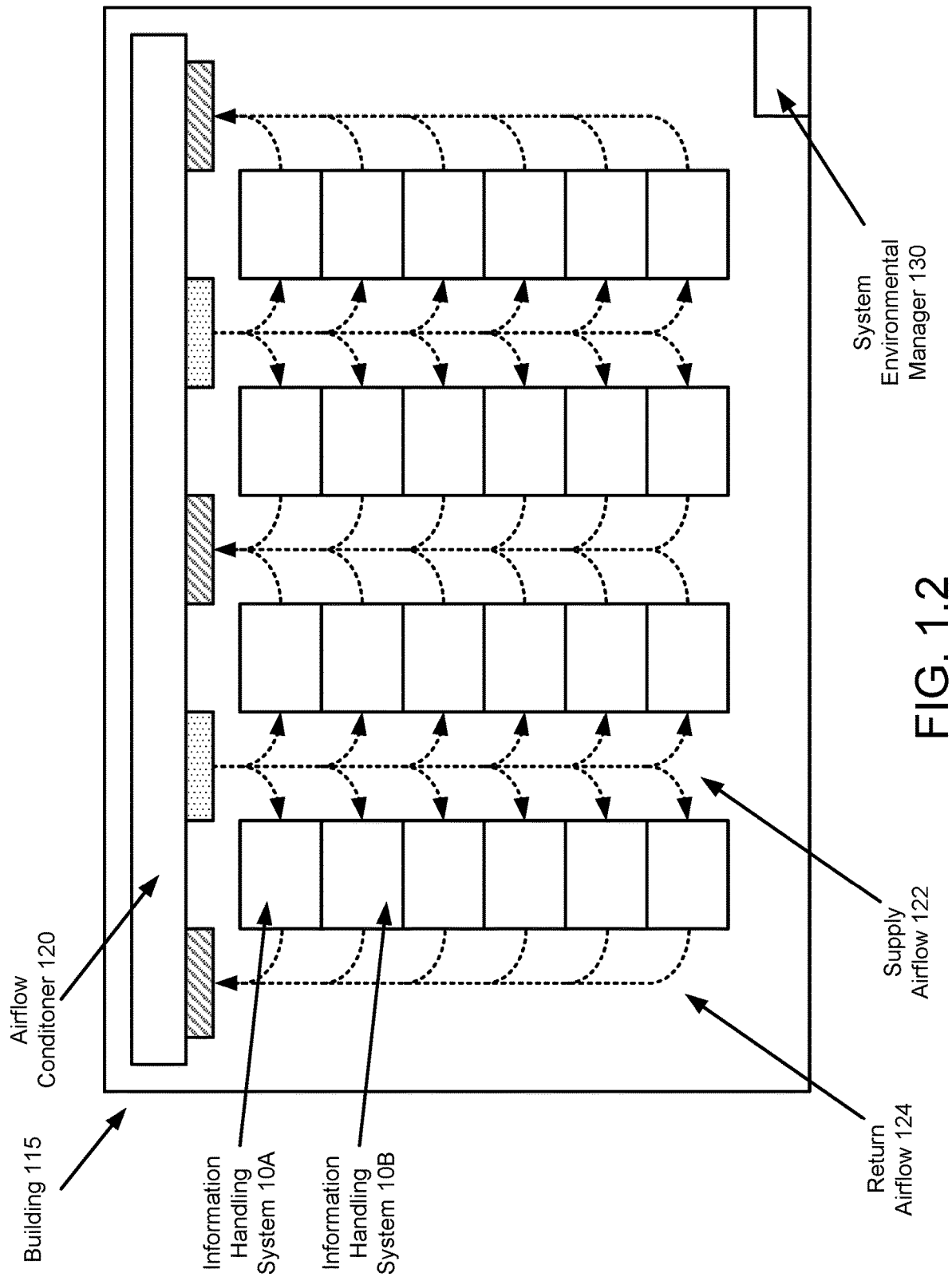
FIG. 1.2

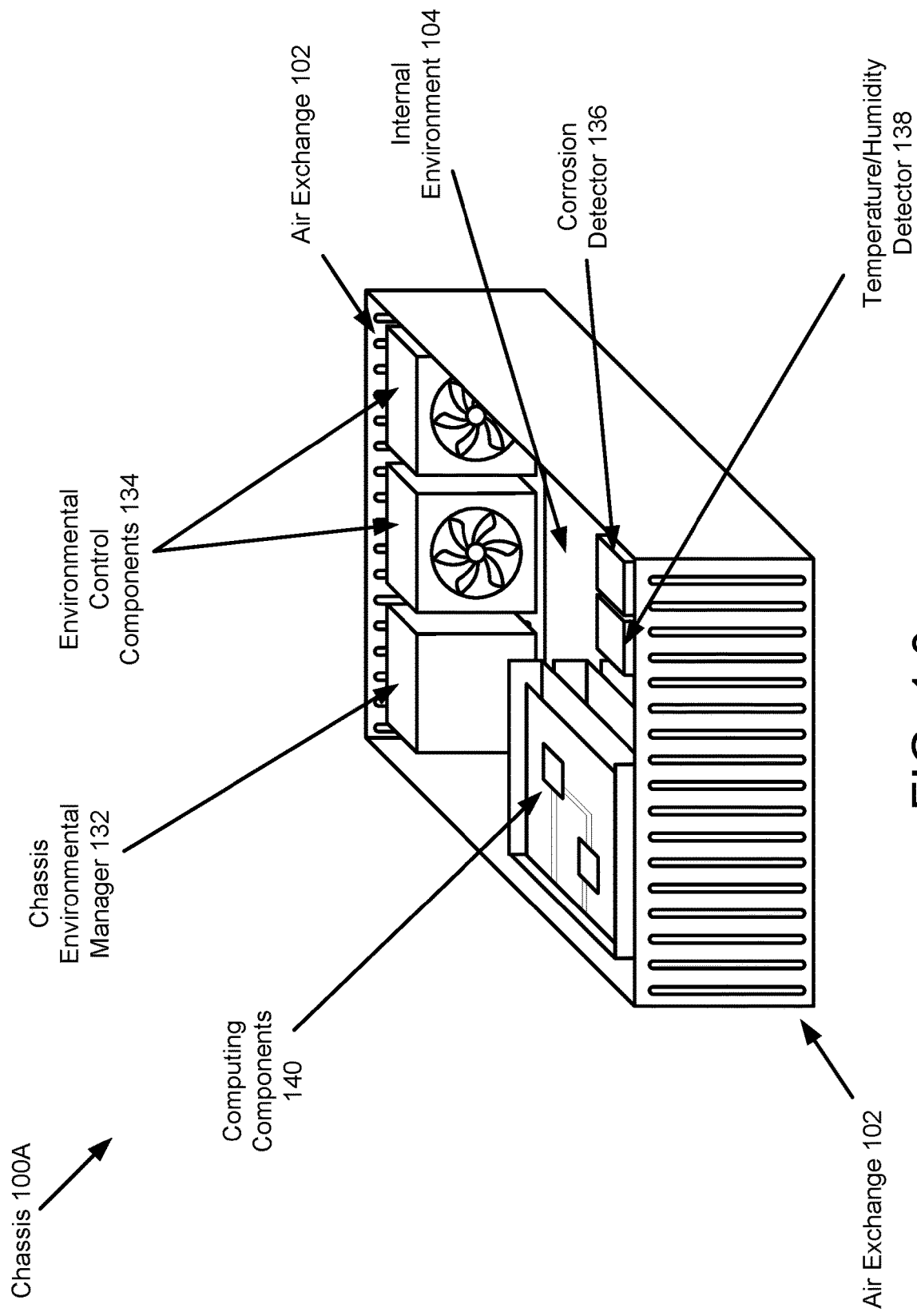
FIG. 1.3

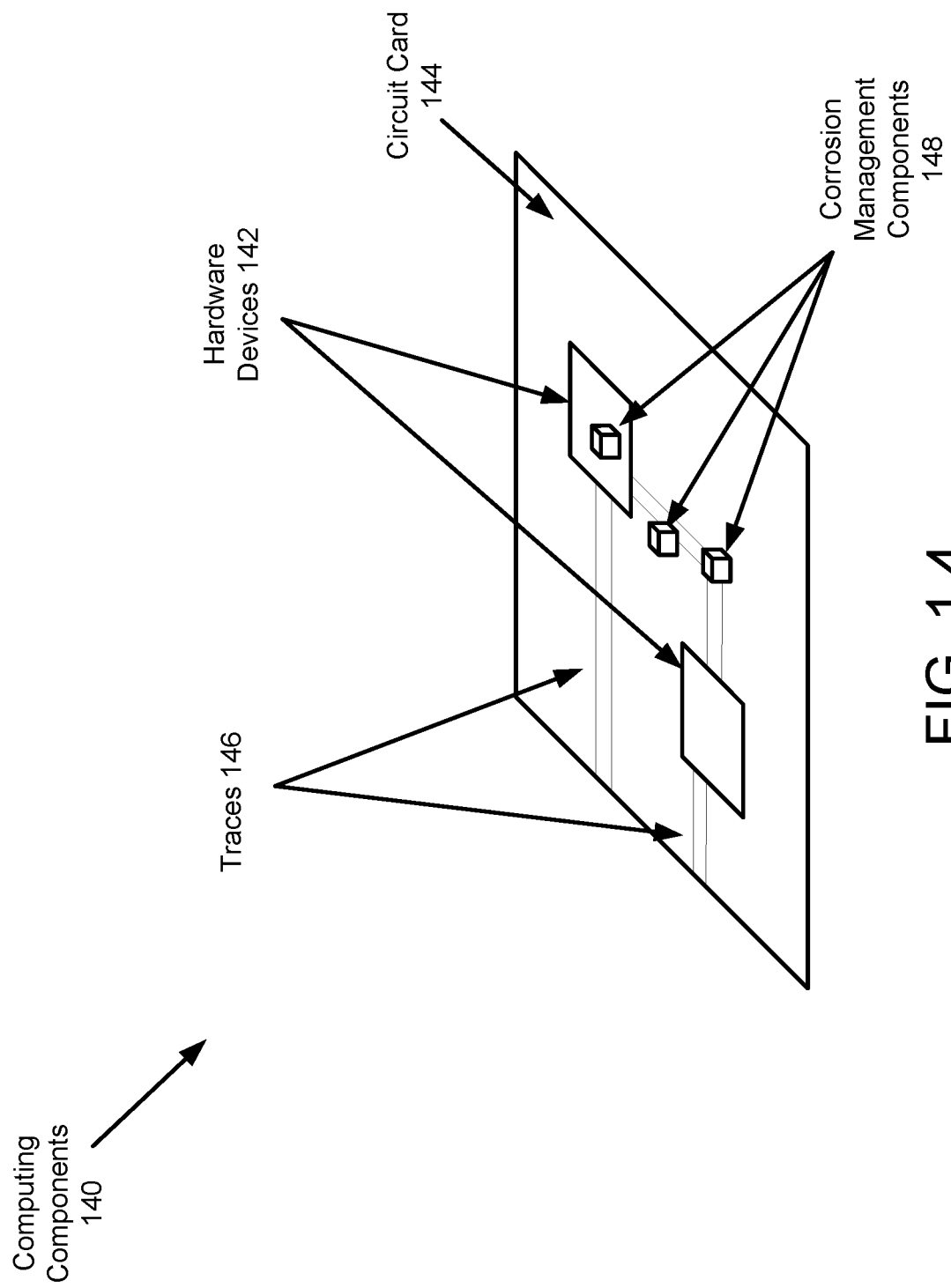
FIG. 1.4

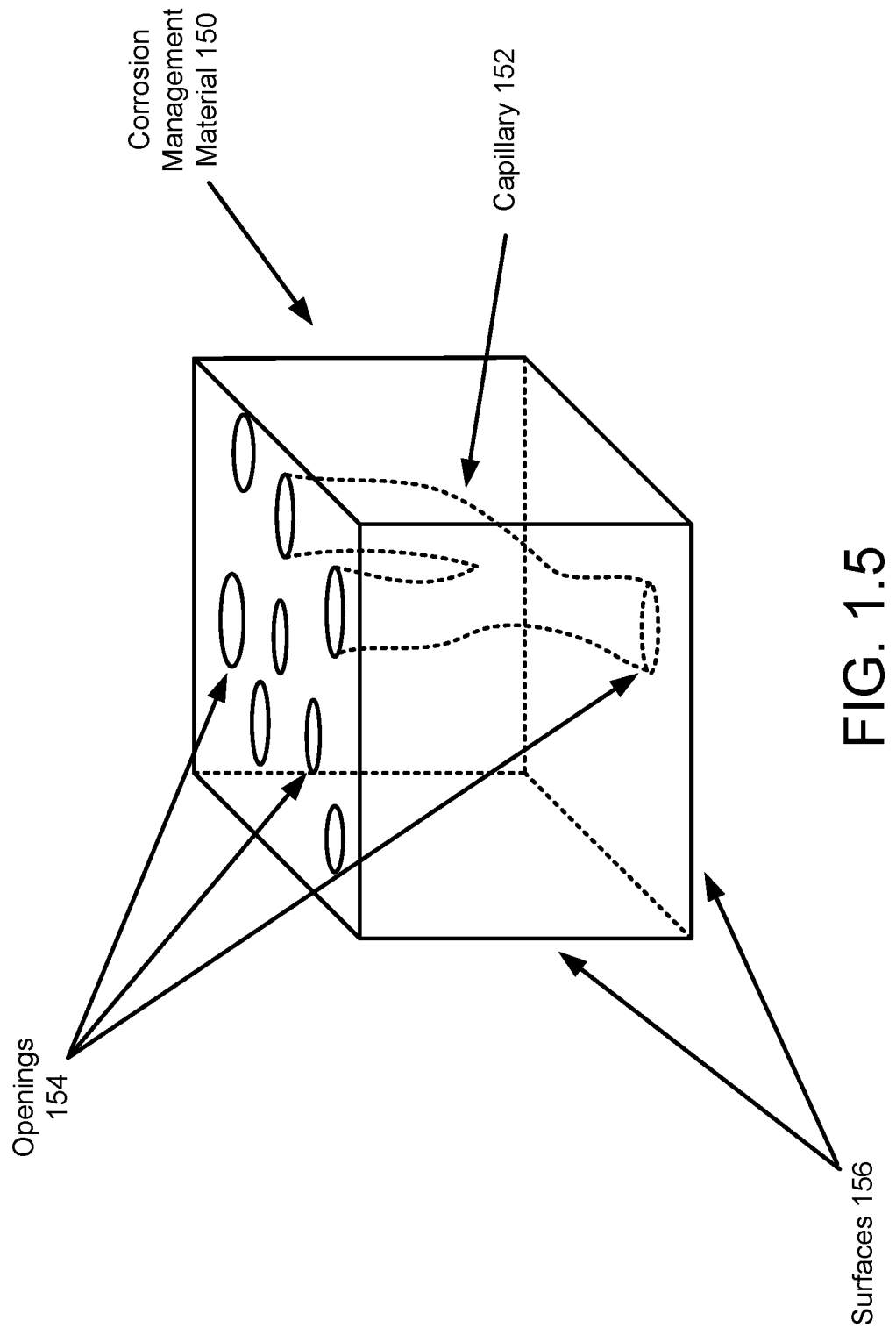
FIG. 1.5

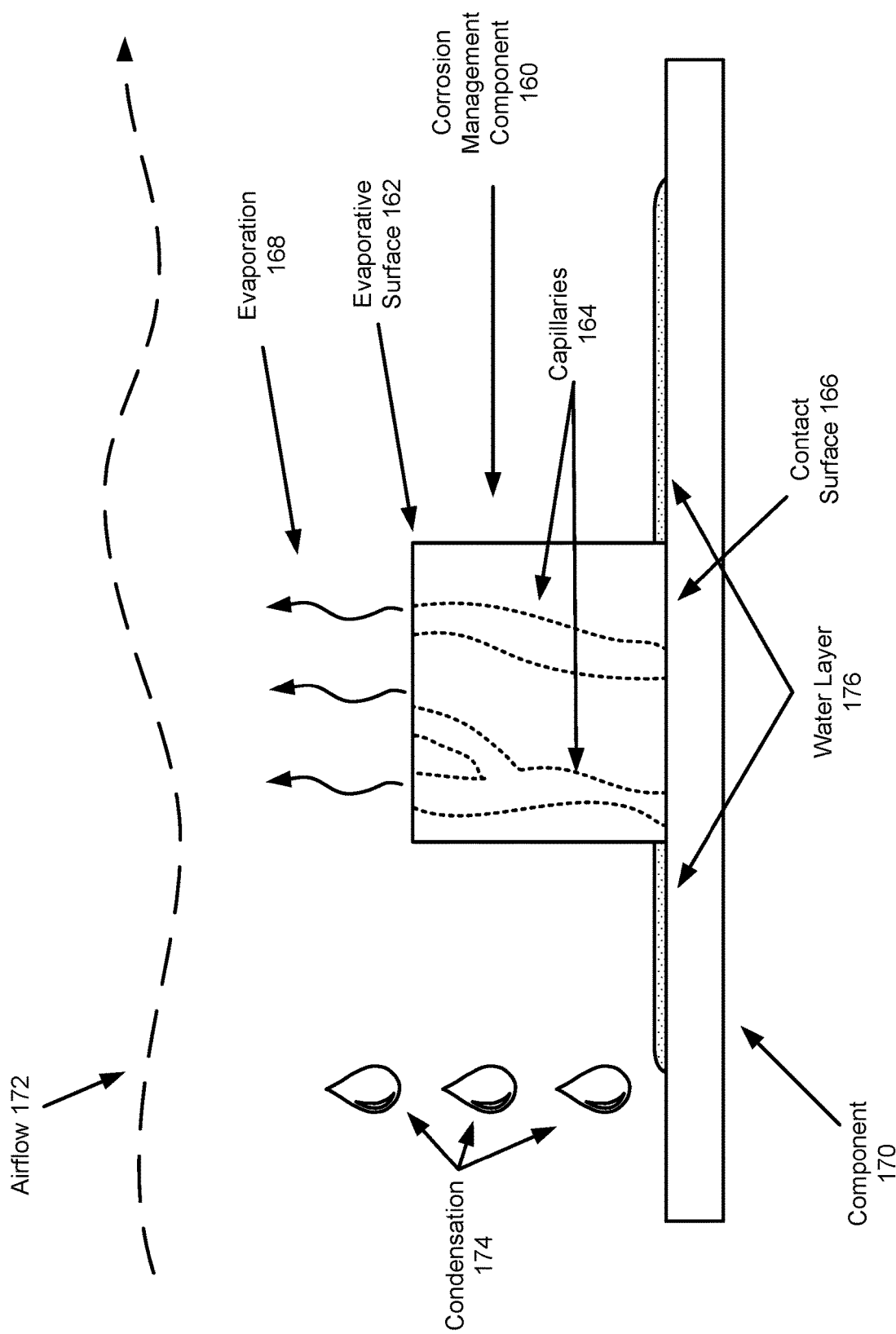
FIG. 1.6

US 11,586,262 B2

SYSTEM AND METHOD FOR SERVICE LIFE MANAGEMENT BASED ON CONDENSATION REMOVAL

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, a computing device of an information handling system in accordance with one or more embodiments of the invention includes a component that is sensitive to corrosion; and a corrosion management component, directly disposed on a surface of the component, that evaporates condensation associated with the component.

In one aspect, a method for environmentally managing a computing device of an information handling system in accordance with one or more embodiments of the invention includes monitoring an environmental corrosion risk associated with a component of the computing device, a corrosion management component that reduces a rate of corrosion of the component due to an ambient environment in which the component resides by removing condensation from the component is associated with the component; making a determination that the component is associated with the corrosion management component; in response to the determination: estimating a corrosion risk of the component based on: the environmental corrosion risk, and a risk reduction factor associated with the corrosion management component; making a second determination that the corrosion risk of the component indicates a premature failure of the component; and remediating, in response to the second determination, the corrosion risk of the component.

In one aspect, a non-transitory computer readable medium includes computer readable program code, which when executed by a computer processor enables the computer processor to perform a method for environmentally managing a computing device of an information handling system, the method includes monitoring an environmental corrosion risk associated with a component of the computing device, a corrosion management component that reduces a rate of corrosion of the component due to an ambient environment in which the component resides by removing condensation from the component is associated with the component; making a determination that the component is associated with the corrosion management component; in response to the determination: estimating a corrosion risk of the component based on: the environmental corrosion risk, and a risk reduction factor associated with the corrosion management component; making a second determination that the corrosion risk of the component indicates a premature failure of the component; and remediating, in response to the second determination, the corrosion risk of the component.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a building that includes information handling systems in accordance with one or more embodiments of the invention.

FIG. 1.3 shows a diagram of a chassis of an information handling systems in accordance with one or more embodiments of the invention.

FIG. 1.4 shows a diagram of computing components in accordance with one or more embodiments of the invention.

FIG. 1.5 shows a diagram of a corrosion management material in accordance with one or more embodiments of the invention.

FIG. 1.6 shows a diagram of a corrosion management component providing corrosion management services to a component in accordance with one or more embodiments of the invention.

DETAILED DESCRIPTION

Figure 2:
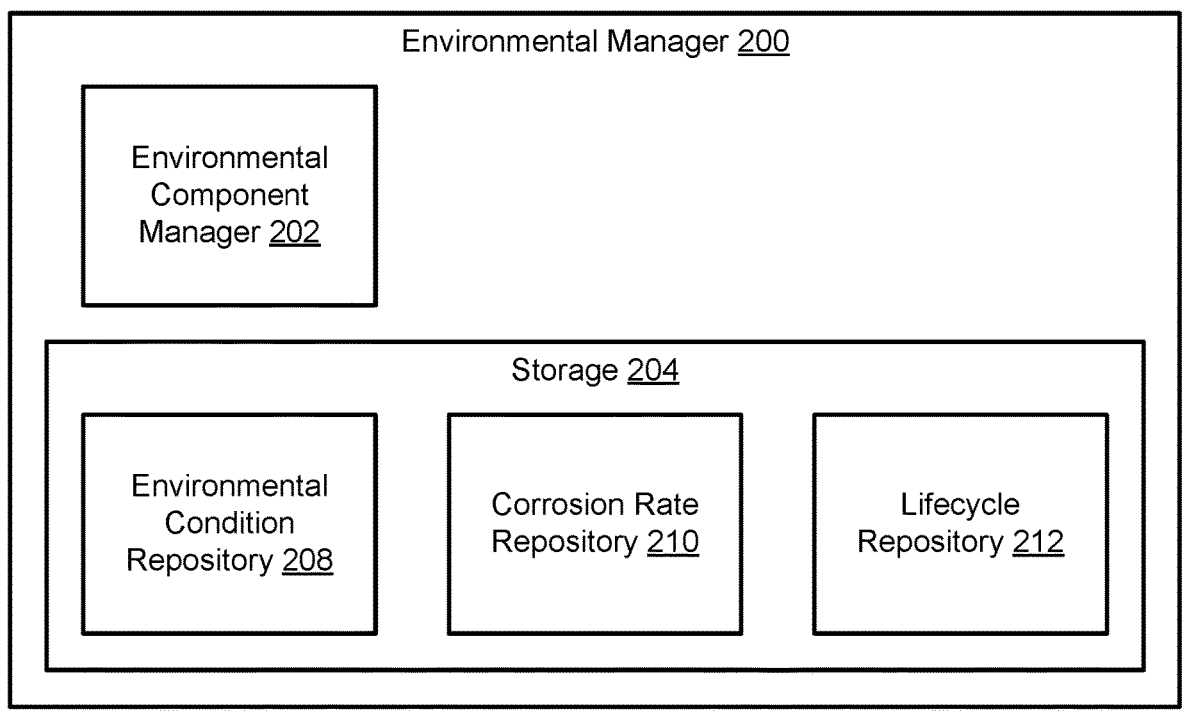
FIG. 2 shows a diagram of an environmental manager of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may be exposed to gases that may cause the components to corrode. For example, humidity in the gases may condense onto surfaces of the components. The condensed water vapor may corrode the components. Corrosion, if left unchecked, may cause the components to fail prior to the computing device meeting its service life goals (e.g., a duration of time the components are expected to operate).

Embodiments of the invention may provide methods and systems that reduce the risk of corrosion related failures in information handling systems. To reduce the risk of corrosion related failures, the system may include corrosion management components. A corrosion management component may reduce the rate of corrosion of one or more components even when the components are exposed to environmental conditions that would cause corrosion.

To reduce the rate of corrosion of a component, a corrosion management component may remove condensation from a surface of a component. Removing the condensation from the surface of the component may reduce the rate at which the component corrodes. For example, the rate of corrosion of the component may depend on the quantity of condensation on the surface of the component. By reducing the amount of condensation on the component, the corrosion rate of the component may be reduced.

In one or more embodiments of the invention, the corrosion management component is a physical structure that includes capillaries. The capillaries may connect a first side of the corrosion management component to a second side. When one of these sides is placed in contact with a component, condensation disposed on the component may be drawn into the capillaries, transferred to the other side of the component through capillary action, and evaporated into the environment thereby reducing the quantity of condensation on the surface of the component.

Any number of corrosion management components may be utilized to manage the corrosion of any number of corrosion sensitive components. In some embodiments of the invention, corrosion management components are utilized to manage the corrosion of components that are particularly sensitive to corrosion. For example, traces having fine pitch and width, large structures, structures that may generally be at lower temperatures then the surrounding environment thereby being at greater risk of high rates of condensation, and/or other types of components that may be more susceptible to corrosion related failure may be managed using corrosion management components.

By doing so, a system in accordance with embodiments of the invention may be less likely to prematurely fail due to corrosion, be more likely to meet its service life goal, be able to accept a wider range of intake gas conditions that may be more likely to cause corrosion without negatively impacting the system, and/or may be less costly to operate by reducing the necessary level of conditioning of gases taken into the chassis of the information handling system for cooling purposes.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may include a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices. For example, the chassis (e.g., 100A-100C) may have form factors compatible with those implemented by the frame (110).

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, buildup of heat within a chassis may cause temperatures of the components disposed within the chassis to exceed preferred ranges.

The preferred ranges may include a nominal range in which the components respectively operate (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange (102) may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic. The gases may not be benign. For example, the gases may be (i) chemically reactive, (ii) include humidity, and/or (iii) otherwise interact with components disposed within the chassis in an undesirable manner. The reaction between the gases used to cool the components and the components themselves (or other components proximate to the to-be-cooled components) may negatively impact the components disposed within the chassis.

For example, if the gases include a chemically reactive component (e.g., chlorine species), the gases may react (i.e., chemically react) with portions of the components disposed within the chassis. These reactions may damage portions of the components resulting in a decreased service life of the components.

In another example, if the gases include humidity, the humidity may (under certain conditions) condense resulting in water being disposed on the surface of the components. When water is disposed on the surface of components (even at very small levels), the water (and/or other reactive chemical species in the water) may chemically react with the components forming corrosion. The aforementioned reactions with the condensed water may damage the components or otherwise cause them to operate in an undesirable manner.

The potential reactions, discussed above, may cause numerous negative impacts. First, the reactions may impact the electrical conductivity of various components. For example, when metals react with chemically reactive species, condensed water vapor, etc., the metals may form chemical compounds that are substantially less conductive than the pure metals. The reduced conductivities of the components may negatively impact the electrical functionality of the components (e.g., circuits) disposed within the chassis.

Second, the reactions may impact the physical size of various components. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to it meeting its service life. A service life may be a desired duration of operation of a component, device, or system. For example, a chassis may have a service life of 2 years, 5 years, 10 years, etc. depending on the design of the chassis and/or goal of an IHS of which the chassis is a member.

To address the above and/or other potential issues, embodiments of the invention may provide methods, devices, and systems that mitigate corrosion. To mitigate corrosion, corrosion management components may be utilized. A corrosion management component may be a component that limits the occurrence of corrosion of one or more components for which the corrosion management component provides corrosion management services.

To provide corrosion management services, the corrosion management components may remove condensation from components. By removing condensation from the components, the rates of corrosion of the components may be reduced. Consequently, even when environmental conditions cause condensation to occur, the corrosion due to the condensation may be reduced by proactively removing the condensation by way of a corrosion management component.

To remove condensation from a component, a corrosion management component may directly interact with a surface of the component upon which condensation may form. The interaction with the surface of the component may transport condensation away from the surface thereby reducing the rates of corrosion of the surface due to the condensation. After being transported away, the condensation may be disposed of by, for example, evaporating the condensation into an airflow. The airflow may transport the evaporated condensation away from the surface of the component. For additional details regarding corrosion management components, refer to FIGS. 1.3-1.6.

In addition to managing corrosion using corrosion management components by removing condensation, a system in accordance with embodiments of the invention may manage the environments themselves based on the risk of corrosion occurring. For example, a system may monitor the environmental conditions and/or rates of corrosion that are occurring to determine if a risk of corrosion exists. If the risk of corrosion, even when corrosion management components are utilized, the system may automatically take steps to modify the environment in which a device subject to corrosion resides to reduce the likelihood that corrosion may cause the device to prematurely fail (e.g., prior to meeting service life goals).

When determining whether corrosion is likely to occur, the system may take into account the presence or lack of corrosion management components. The presence or lack of corrosion management components may indicate whether corrosion is occurring at reduced or elevated rates. By taking into account the presence of corrosion management components, a system in accordance with embodiments of the invention may tailor its use of gas conditioning to reduce energy consumption while still prevent corrosion related failures of components during the service of the components and/or IHSs that incorporate the components.

Figure 3:
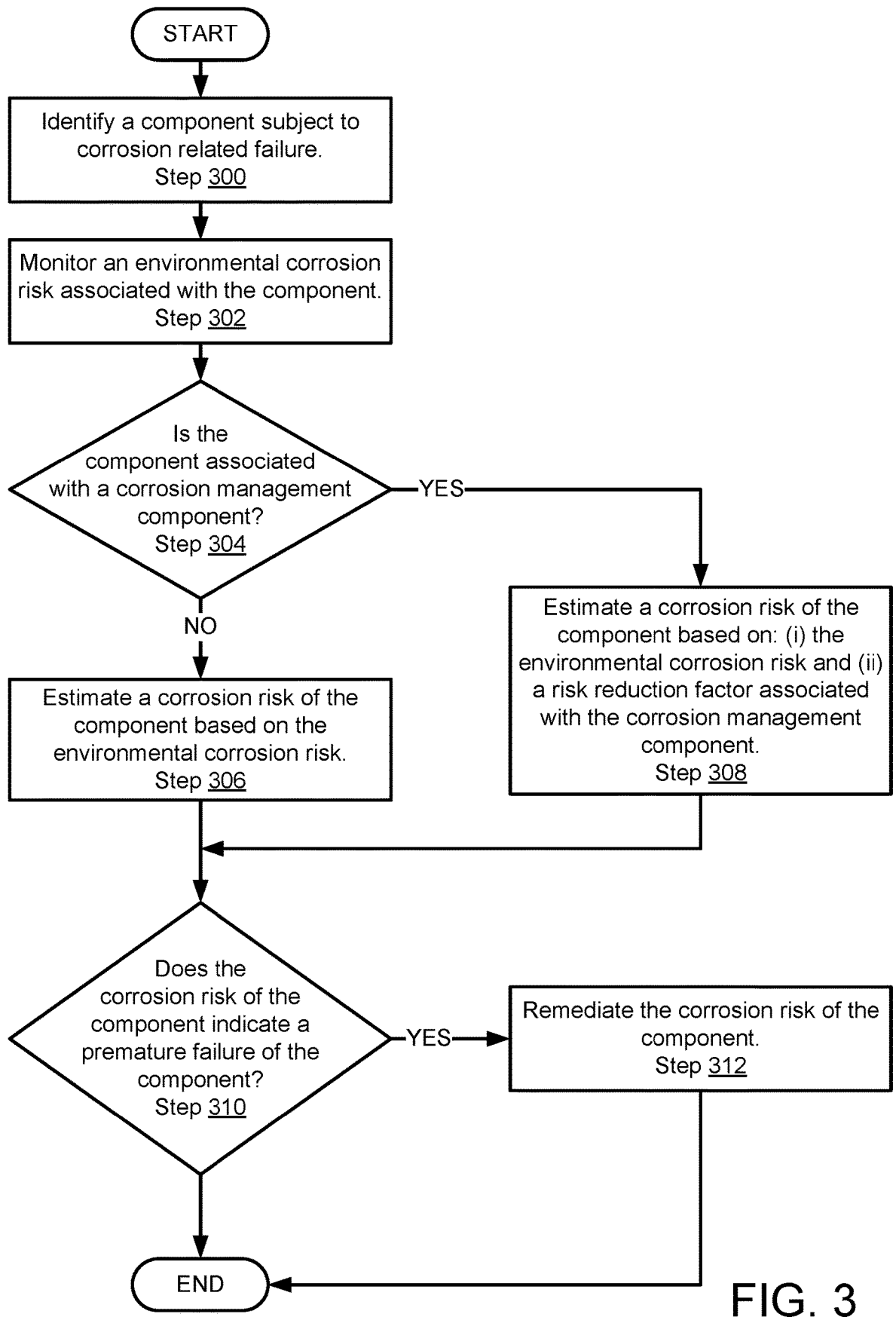
FIG. 3 shows a flowchart of a method of managing an internal environment of a chassis of an information handling system in accordance with one or more embodiments of the invention.

For additional details regarding environment management, refer to FIGS. 2-3.

To further clarify the environments in which corrosion may arise, a diagram of an environment in which a chassis may reside is illustrated in FIG. 1.2 and a diagram of a chassis is provided in FIG. 1.3.

Turning to FIG. 1.2, FIG. 1.2 shows a top view diagram of a building (115) in which chassis may reside in accordance with one or more embodiments of the invention. The building (115) may house a data center (e.g., an aggregation of information handling systems) that includes any number of information handling systems (e.g., 10A, 10B). The information handling systems may include chassis which may need to intake and exhaust gases for temperature regulation purposes.

To facilitate gas management within the building (115), the information handling systems may be organized into rows (or other groupings of information handling systems). In FIG. 1.2, the rows of information handling system extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled (and/or humidity reduced), and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.).

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

The system environmental manager (130) may be implemented using a computing device. For additional details regarding computing devices, refer to FIG. 4. The system environmental manager (130) may perform all, or a portion, of the method illustrated in FIG. 3 while providing its functionality.

Turning to FIG. 1.3, FIG. 1.3 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services). To provide services, the computing device may utilize computing resources provided by computing components (140). The computing components (140) may include, for example, processors, memory modules, storage devices, special purpose hardware, and/or other types of physical components that contribute to the operation of the computing device. For additional details regarding computing devices, refer to FIG. 4.

Because the computing device uses computing components (140) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis.

To maintain the temperatures of the computing components (140) (and/or other types of components) within a nominal range, gases may be taken in through an air exchange (102). The gases may be passed by the computing components (140) to exchange heat with them. The heated gases may then be expelled out of another air exchange (102).

However, by taking in and expelling gases used for cooling purposes, the components disposed within the chassis (100A) may be subject to degradation due to corrosion. For example, as discussed above, the gases may include components such as humidity or chemical species that may condense on and chemically react with the computing components (140) and/or other types of components disposed in the chassis (100A) forming corrosion. The chemical reaction products (e.g., corrosion) may damage the structure and/or change the electrical properties of the computing components (140). These changes may negatively impact the ability of the computing device to provide its functionality.

For example, the computing device may have a service life during which it is expected that the computing device will be likely to provide its functionality. However, changes in the structure and/or electrical properties of these components due to exposure to humidity or other components of the gases used for temperature regulation purposes may cause the components to prematurely fail ahead of the service life of the computing device due to corrosion formation.

In general, embodiments of the invention provide methods, devices, and systems for managing corrosion within chassis. To manage corrosion, a system in accordance with embodiments of the invention may (i) reduce the likelihood of corrosion occurring, (ii) monitoring the occurrence of corrosion, and (iii) based on the monitoring, modify the internal environment of a chassis to reduce the prevalence of corrosion and/or reduce the amount of power used for environmental management purposes.

By doing so, embodiments of the invention may reduce the likelihood of components prematurely failing due to corrosion while limiting power consumption. By reducing the likelihood of the occurrence of premature failures of computing components, the computing devices disposed within the chassis (100A) may be more likely to meet their respective service life goals, have lower operation costs, and/or require fewer repairs during their respective service life. For additional details regarding the computing components (140), refer to FIG. 1.4.

To manage the internal environment (104) of the chassis, the chassis (100A) may include a chassis environmental manager (132). The chassis environmental manager (132) may provide environmental management services. Environmental management services may include (i) obtaining information regarding the rates of corrosion occurring within the chassis, (ii) determining, based on the corrosion rates, whether the devices and/or components thereof within the chassis are likely to meet their service life goals, and (iii) modifying the operation (e.g., modifying operating points) of chassis environmental manager (132) and/or characteristics of gases taken into the chassis to reduce the likelihood of premature failure of components disposed within the chassis (100A) due to corrosion and/or reduce the amount of power consumed for environmental management purposes. For additional details regarding the chassis environmental manager (132), refer to FIG. 2.

While illustrated in FIG. 1.3 as a physical structure, as will be discussed with respect to FIG. 2, the chassis environmental manager (132) may be implemented as a logical entity (e.g., a program executing using the computing components (140)). For example, a computing device disposed in the chassis may host an application (e.g., computer instructions being executed by a processor) that provides the functionality of the chassis environmental manager (132).

To enable the chassis environmental manager (132) to provide its functionality, the chassis (100A) may include one or more detectors (e.g., 136, 138). These detectors may enable the rates of corrosion of various components disposed within the chassis (100A) to be determined and/or environmental conditions within the chassis to be determined. These detectors may be implemented as sensors or other types of physical devices that are operably connected to the chassis environmental manager (132). Any number of corrosion detectors (e.g., 136), temperature detectors (e.g., 138), humidity detectors (e.g., 138), and/or other types of detectors may be disposed at any number of locations throughout the chassis (100A).

In some embodiments of the invention, the functionality of a temperature detector may be provided by, in all or in part, the computing components (140). For example, the computing components (140) may include functionality to report their respective temperatures and/or temperatures of the internal environment (104) of the chassis (100A).

The chassis (100A) may also include chassis environmental manager (132). The chassis environmental manager (132) may include physical devices that include functionality to modify characteristics (e.g., temperature, humidity level, airflow rates/directions) of the internal environment (104) of the chassis (100A). The chassis (100A) may include any number of environmental control components (134) disposed at any number of locations within the chassis.

For example, the chassis environmental manager (132) may include gas movers such as fans. The fans may be able to modify the rate of gases being taken into and expelled from the chassis (100A) through the air exchangers (e.g., 102). The rate of intake and exhaust of gases may cause an airflow to be generated within the internal environment (104). The airflow may be used to modify the rate of thermal exchange between the computing components (140) and the internal environment (104) (e.g., an environment proximate to the computing components (140)).

In another example, the chassis environmental manager (132) may include heaters. The heaters may be able to modify the temperature of the internal environment (104). For example, heaters may be disposed at a front of the chassis (e.g., where gases are taken into the chassis) and/or about different locations within the chassis. These heaters may be used to generally and/or locally heat the internal environment (104). By doing so, the relative humidity level and temperature of the internal environment (104) proximate to the computing components (140) and/or different components may be controlled. The temperature and/or relative humidity level may be utilized to limit, reduce, or otherwise control corrosion rates of the computing components (140).

In a still further example, the chassis environmental manager (132) may include components that are not disposed in the chassis (not shown). For example, the environmental control components may include an airflow conditioner discussed with respect to FIG. 1.2. These external components may be used in conjunction with the environment control components disposed within the chassis to manage the temperature and/or relative humidity levels throughout the internal environment (104) of the chassis.

The chassis (100A) may include any number and type of environmental control components without departing from the invention. Any of the environmental control components may be implemented using physical devices operably connected to and/or controllable by the chassis environmental manager (132) and/or a system environmental manager (e.g., 130, FIG. 1.2) (alone or in combination, these managers may cooperate to provide the functionality of an environmental manager able to utilize both local resources of a chassis and larger resources such as airflow conditioning systems). Any number of chassis environmental managers and system environmental managers may cooperatively operate to control the temperature and/or relative humidity levels of the internal environments of any number of chassis to control the rate of corrosion occurring within the chassis and/or manage the thermal load generated by the computing components (140) and/or other components.

To cooperatively operate, the chassis environmental managers and system environmental managers may be operably connected to one another (e.g., via wired and/or wireless networks). The aforementioned components may share information with one another (e.g., detector data, operating set points of different environmental control components, etc.). These components may implement any type of model for controlling and/or delegating control of the system for temperature, relative humidity level, and/or corrosion rate management purposes. When providing their respective functionalities, these components may perform all, or a portion, of the method illustrated in FIG. 3. Any of these components may be implemented using a computing device. For additional details regarding computing devices, refer to FIG. 4.

While the chassis (100A) of FIG. 1.3 has been illustrated as including a limited number of specific components, a chassis in accordance with one or more embodiments of the invention may include additional, fewer, and/or different components without departing from the invention. Additionally, while the chassis (100A) is illustrated as having a specific form factor (e.g., rack mount), a chassis in accordance with embodiments of the invention may have different form factors without departing from the invention.

As discussed above, the chassis (100A) may house computing components (140). Turning to FIG. 1.4, FIG. 1.4 shows a diagram of computing components (140) in accordance with one or more embodiments of the invention. The computing components (140) may enable computing devices to provide services, as discussed above.

The computing components (140) may include any number of hardware devices (142). The hardware devices (142) may include, for example, packaged integrated circuits (e.g., chips). The hardware devices (142) may enable any number and type of functionalities to be performed by a computing device.

The computing components (140) may also include a circuit card (144). The circuit card (144) may enable any of the hardware devices (142) to be operably connected to one another and/or other components not illustrated in FIG. 1.4. For example, the circuit card (144) may be a multilayer printed circuit board that includes circuitry.

The circuit card (144) may include traces (146) that electrically interconnect various hardware devices (142) to one another and/or other components not illustrated in FIG. 1.4 (e.g., via connectors not shown in FIG. 1.4 that enable the traces of the circuit card (144) to be connected to traces of other circuit cards). The traces (146) may be formed out of conductive materials, such as, copper thereby enabling electrical power to be provided to the hardware devices (142), electrical signals to be distributed among the hardware devices (142), etc.

Returning to the hardware devices (142), these devices may consume electrical power and generate heat as a byproduct of performing their functionality. Further, the hardware devices (142) may have some sensitivity to temperature. For example, the hardware devices (142) may only operate nominally (e.g., as designed) when the temperatures of the respective hardware devices (142) are maintained within a preferred temperature range. Consequently, all, or a portion, of the hardware devices (142) may require some level of cooling to continue to operate nominally.

As discussed above, to facilitate cooling of the hardware devices (142), airflows within the chassis may be generated by environmental control components such as fans, heaters, etc. The airflows may cause gases that are at different temperatures and/or relative humidity levels to be taken into the chassis, used for cooling purposes, and then expelled from the chassis.

However, this process may be problematic because the gases used for cooling purposes may also contribute to corrosion being formed on, for example, the traces (146), interconnections between the traces (146) and the hardware devices (142), etc. For example, when the traces (146) are exposed to gases that include humidity, the metals of the traces (146) may react with the gases thereby forming corrosion. More specifically, water vapor or other gases may condense forming a layer disposed on one or more surfaces of the traces and/or the hardware devices (142). The layer of condensed water may chemically interact with these components thereby forming corrosion.

The corrosion may, if kept to a low level, not impact the ability of the hardware devices (142) to perform their functionality over the course of the desired lifetime (e.g., service life) of a computing device. In contrast, if the rate of corrosion increases to a high enough level, the corrosion may negatively impact the ability of the hardware devices (142) to perform their respective functionalities to a level that causes the computing device to fail. Consequently, the computing device and corresponding IHS may fail prior to it meeting its desired service life due to corrosion.

For example, if an IHS has a desired service life of five years, corrosion may cause one of the traces (146) to fail prior to five years of service thereby causing the IHS to prematurely fail.

Additionally, the rate of corrosion of these components may be proportional to the quantity of condensed water on the surfaces of the components. For example, if a minimal amount of condensed water is disposed on the components, the rate of corrosion of the components may be very low. In contrast, if significant amount of condensed water a present, the rate of corrosion of the components may be high. A high rate of corrosion may cause the components to fail prior to them meeting their service life goals.

To reduce the impact of corrosion on the traces (146), hardware devices (142), and/or other components, the computing components (140) may include any number of corrosion management components (148). As discussed above, a corrosion management component may provide corrosion management services. The corrosion management services may include removing condensed water from surfaces of component (e.g., corrosion sensitive components) of components that may be subject to failure due to the formation of corrosion.

The corrosion management components (148) may reduce the rates of corrosion of corresponding components by removing condensed water from their surfaces. By doing so, the rates of corrosion of the components may be reduced even when in environments that are conducive to condensation formation. For example, when the temperature and/or relative humidity level make it more likely that condensation will form on the surfaces of the components. Generally, condensation is more likely to form when the relative humidity level increase.

For additional details regarding the corrosion management components, refer to FIGS. 1.5-1.6.

While the computing components (140) are illustrated in FIG. 1.4 as including specific numbers and specific types of components, computing component in accordance with one or more embodiments of the invention may include additional, different, and/or fewer components without departing from the invention.

Additionally, while a limited number of corrosion management components (148) are illustrated in FIG. 1.4, any number of corrosion management components (148) may be implemented with any number of computing components without departing from the invention. Further, some of the components with which corrosion management components are integrated may not be computing components. The aforementioned components may perform other functions than that of computing components. Rather, a corrosion management component may be integrated with any type of component that is sensitive to corrosion (e.g., may not meet its service life goals or may otherwise be negatively impacted by corrosion).

Corrosion management components may include corrosion management materials. Turning to FIG. 1.5, FIG. 1.5 shows a diagram of a corrosion management material (150) in accordance with one or more embodiments of the invention. In FIG. 1.5, the corrosion management material (150) is illustrated as a square block. However, a corrosion management material may have other shapes without departing from the invention.

As discussed above, corrosion management components may manage corrosion of other components. To do so, the corrosion management components may remove condensation from surfaces of the components.

To remove condensation, the corrosion management material (150) may include any number of capillaries (e.g., 152). The capillaries may be voids in an interior of the corrosion management material (150). The voids may have shapes that apply capillary forces to liquids disposed in the capillaries. In FIG. 1.5, portions of the capillaries and openings of the corrosion management material (150) that would not be viewable from the viewpoint in FIG. 1.5 are illustrated using dashed lines. Additionally, for clarity, only one capillary (152) is illustrated in FIG. 1.5. Any number of capillaries may traverse through the interior of the corrosion management material (150) without departing from the invention.

The capillaries may interconnect any number of openings (154) on any number of surfaces (156) of the corrosion management material. The openings (154) may cause liquid (e.g., condensed water vapor) disposed proximate to one of the surfaces (156) of the corrosion management material (150) to enter capillaries (152), be moved through the capillaries due to capillary forces, and be at least partially disposed on a second side of the corrosion management materials (150). As will be discussed in greater detail with respect to FIG. 1.6, when a corrosion management material (150) is disposed on a surface on which liquids are present (e.g., condensed water), the liquids may be wicked into the corrosion management material (150) and at least partially expelled on a surface of the corrosion management material (150) away from the surface on which the corrosion management material (150) is disposed.

In one or more embodiments of the invention, the corrosion management material (150) is formed as an open celled foam. The open celled foam may have a cell size of sufficiently small size that the cells form capillaries through the material. In one or more embodiments of the invention, the foam is a metal foam.

In one or more embodiments of the invention, the corrosion management material (150) is rough surfaces. The rough surfaces may provide a large surface area over which liquids wicked into the corrosion management material (150) may be spread. The large surface area may facilitate rapid evaporation of liquids that are wicked into the corrosion management material.

In one or more embodiments of the invention, the corrosion management material (150) is formed from plastic. For example, a plastic open cell foam may be utilized to form the corrosion management material.

In one or more embodiments of the invention, the corrosion management material (150) includes tubes (e.g., capillaries). The tubes may be bundled together to form a two-dimensional array (organized or disorganized) of tubes. The tubes may be formed of any material including, for example, metals, ceramics, polymers, etc.

The corrosion management material may be formed via other methods without departing from the invention. For example, the corrosion management material (150) may be formed by machining a block of material, may be formed using electrochemical deposition of metals, may be formed using electroless deposition, etc.

In one or more embodiments of the invention, the capillaries of the corrosion management material (150) are aligned in a predetermined direction. For example, the capillaries may be aligned with each other as illustrated in FIG. 1.5 to preferentially interconnect the openings (154) on two sides of the corrosion management material (150). In some embodiments of the invention, not all of the capillaries are aligned. Some portion of the capillaries may be aligned with a direction other than a preferred direction of alignment.

While the corrosion management material (150) has been illustrated in FIG. 1.5 as including a limited number of specific components, a corrosion management material (150) in accordance with embodiments of the invention may include additional, fewer, and/or different components than those illustrated in FIG. 1.5 without departing from the invention.

To further clarify aspect of corrosion management materials, a diagram of a corrosion management component (160) disposed on a component (170) in accordance with one or more embodiments of the invention is shown in FIG. 1.6. In FIG. 1.6, the corrosion management component (160) is providing corrosion management services to the components (170).

By virtue of the temperature of the component (170) and relative humidity level of the environment proximate to the component, condensation (174) may form. The condensation (174) may form a water layer (176) disposed on a surface of the component (170). If left unchecked, the water layer (176) may cause the surface of the component (170) to corrode at a high rate which, in turn, may cause the component (170) to prematurely fail due to the corrosion.

To manage corrosion of the component (170), the corrosion management component (160) may be directly disposed on the component (170). By being disposed on the component (170), the corrosion management component (160) may interact with the water layer (176) that, if left unchecked, may cause high rates of corrosion of the component (170).

The corrosion management component (160) may include capillaries (164) that interconnect: (i) the surface of the corrosion management component in contact with the component (170) and (ii) an evaporative surface (162) of the corrosion management component. The evaporative surface (162) may be disposed on a side of the corrosion management component opposite (or otherwise disposed away from the contact surface (166)) of the component (170). The capillaries (164) may intake portions of the water layer (176) and transport them to the evaporative surface (162) via capillary action. Accordingly, the corrosion management component (160) may reduce the quantity of the water layer (176) on the component (170) to a level that reduces the rate of corrosion such that the component (170) is unlikely to fail prior to it meeting its service life.

The evaporative surface (162) of the corrosion management component (160) may cause the portion of the water layer (176) transported to it to be evaporated. The resulting evaporation (168) may be transported away from the component (170) by an airflow (172) or other environmental condition.

By integrating corrosion management components (e.g., 160), components sensitive to corrosion may be utilized in environment that would otherwise cause the components to fail, due to their corrosion, prior to meeting their service life goals. Consequently, less energy may need to be spent conditioning airflows or gases used for thermal regulation purposes. For example, less humidity may need to be removed from these gases because the corrosion management components may prevent the formation of corrosion due to the humidity that would otherwise occur in their absence.

However, the impact of corrosion management components on corrosion may need to be taken into account when managing the environment within a chassis to reduce the amount of energy used for gas conditioning. To do so, an environmental manager in accordance with embodiments of the invention may take into account impact of corrosion management components when managing the environment of chassis.

Turning to FIG. 2, FIG. 2 shows a diagram of an environmental manager (200) in accordance with one or more embodiments of the invention. The system environmental manager (130) and/or chassis environmental manager (132) illustrated in FIGS. 1.2 and 1.3, respectively, may be similar to and/or be part of the environmental manager (200). The functionality of the environmental manager may be provided in part, or entirely, by any number of system environmental managers (e.g., 130, FIG. 1.2) and/or chassis environmental managers (e.g., 132, FIG. 1.3) (e.g., these components operating as a distributed system that provide the functionality of the environmental manager).

As discussed above, the environmental manager (200) may provide environmental management services. Environmental management services may reduce the likelihood that IHSs fail prematurely (e.g., prior to meeting service life goals) due to corrosion of components of the IHSs.

In one or more embodiments of the invention, the environmental manager (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the environmental manager (200) described through this application and all, or a portion, of the method illustrated in FIG. 3. The environmental manager (200) may be implemented using other types of computing devices without departing from the invention. For additional details regarding computing devices, refer to FIG. 4.

In one or more embodiments of the invention, the environmental manager (200) is implemented using distributed computing devices. As used herein, a distributed computing device refers to functionality provided by a logical device that utilizes the computing resources of one or more separate and/or distinct computing devices. For example, in one or more embodiments of the invention, the environmental manager (200) is implemented using distributed devices that include components distributed across any number of separate and/or distinct computing devices. In such a scenario, the functionality of the environmental manager (200) may be performed by multiple, different computing devices without departing from the invention.

To provide environmental management services, the environmental manager (200) may include an environmental component manager (202) and a storage (204). Each of these components is discussed below.

The environmental component manager (202) may manage the components of the chassis and/or other components that may be used to control the characteristics (e.g., temperature, humidity level, airflow rates, etc.) of the internal environment of the chassis. To manage them, the environmental component manager (202) may (i) obtain information regarding the environmental conditions within the chassis including temperatures, humidity levels, airflow rates, corrosion rates, presence or lack of corrosion management components, etc., (ii) determine, using the environmental information, whether the IHS is likely to prematurely fail due to corrosion, and (iii) if the IHS is unlikely to meet its service life goals due to premature failure, modify the characteristics of the internal environment of the chassis to improve the likelihood that the IHS will meet its service life goals.

To obtain information regarding the environmental conditions, the environmental component manager (202) may request such information from computing components (e.g., temperatures), detectors (e.g., corrosion, temperature, humidity, and/or other types of sensors), and/or other types of devices (e.g., components external to the chassis). In response, the aforementioned components may provide the requested information to the environmental component manager (202). The environmental component manager (202) may store the aforementioned information as part of an environmental condition repository (208). The environmental component manager (202) may also be provided information regarding the presence of corrosion management components when a chassis is assembled and/or modified to include and/or remove such components. The information may also include the ability of these components to reduce the rates of corrosion of corresponding components.

To ascertain whether an IHS is likely to prematurely fail due to corrosion, the environmental component manager (202) may estimate a total amount of corrosion that has likely occurred (e.g., on an aggregate and/or per component level), estimate the rate that corrosion will occur in the future, and use the amount of corrosion that has occurred and the current rate of corrosion of components to determine whether the IHS is likely to prematurely fail due to fail. To generate the estimates, the environmental component manager (202) take into account environmental conditions and whether any of the components are associated with corrosion management components that may reduce the rates of corrosion of the associated components.

Utilizing these estimates, the environmental component manager (202) may determine whether the computing device is unlikely to meet its service life goal due to corrosion. To make this determination, the environmental component manager (202) may utilize a lifecycle repository (212). The lifecycle repository (212) may specify information that may be used to ascertain whether a premature failure will occur based on corrosion. For example, the lifecycle repository (212) may specify a total amount of corrosion that will cause various components of a computing device to fail. Based on the corrosion estimates, the environmental component manager (202) may ascertain whether the amount of corrosion specified by the lifecycle repository (212) will be exceeded prior to the occurrence of the service life of the IHS.

If it is determined that the IHS will prematurely fail, the environmental component manager (202) may modify the operation of one or more environmental control components to reduce the corrosion rate within the chassis. For example, the environmental component manager (202) may increase the ambient temperature within the chassis, decrease the relative humidity level, modify airflow rates within the chassis, and/or otherwise modify the internal environment of the chassis to reduce the rate that corrosion occurs in the chassis. By doing so, the point in time at which the IHS is likely to fail due to corrosion may be pushed into the future thereby reducing the likelihood that the IHS will prematurely fail ahead of its service life being completed.

When providing its functionality, the environmental component manager (202) may utilize the storage (204) by storing and using previously stored data structures.

To provide the above noted functionality of the environmental component manager (202), the environmental component manager (202) may perform all, or a portion, of the method illustrated in FIG. 3.

In one or more embodiments of the invention, the environmental component manager (202) is implemented using a hardware device including circuitry. The environmental component manager (202) may be implemented using, for example, a digital signal processor, a field programmable gate array, or an application specific integrated circuit. The environmental component manager (202) may be implemented using other types of hardware devices without departing from the invention.

In one or more embodiments of the invention, the environmental component manager (202) is implemented using computing code stored on a persistent storage that when executed by a processor performs all, or a portion, of the functionality of the environmental component manager (202). The processor may be a hardware processor including circuitry such as, for example, a central processing unit or a microcontroller. The processor may be other types of hardware devices for processing digital information without departing from the invention.

In one or more embodiments disclosed herein, the storage (204) is implemented using devices that provide data storage services (e.g., storing data and providing copies of previously stored data). The devices that provide data storage services may include hardware devices and/or logical devices. For example, storage (204) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (204) may include a memory device (e.g., a dual in line memory device) in which data is stored and from which copies of previously stored data are provided. In another example, storage (204) may include a persistent storage device (e.g., a solid state disk drive) in which data is stored and from which copies of previously stored data are provided. In a still further example, storage (204) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (204) may store data structures including an environmental condition repository (208), a corrosion rate repository (210), and a lifecycle repository (212). Each of these data structures is discussed below.

The environmental condition repository (208) may include one or more data structures that include information regarding the environmental conditions within a chassis. For example, when temperature, humidity, airflow rate, and/or corrosion data is read from a detector, the read information may be stored in the environmental condition repository (208). Consequently, a historical record of the environmental conditions in the repository may be maintained.

The environmental condition repository (208) may include any type and quantity of information regarding the environmental conditions within the chassis. For example, the environmental condition repository (208) may include temperature sensor data from discrete temperature sensors and/or temperature sensors integrated into computing components (and/or other types of devices). In another example, the environmental condition repository (208) may include corrosion rates from discrete or integrated corrosion detectors (e.g., on board a circuit card). In a still further example, the environmental condition repository (208) may include airflow rate data regarding the flow of gases within a chassis.

In addition to the data obtained using sensors, the environmental condition repository (208) may include spatial data regarding the relative locations of components within a chassis. For example, some components may be disposed away from the detectors. Consequently, it may not be possible to directly measure the temperature, relative humidity level, airflow rates, and/or corrosion of such components. The spatial data may be used to estimate, using measured temperatures, relative humidity levels, and/or corrosion, the likely corrosion rates of the components.

Additionally, the environmental condition repository (208) may include information regarding whether components are associated with corrosion management components. For components that are associated with corrosion management components, the environmental condition repository (208) may specify correction factors with respect to the rates of corrosion of these components for corresponding environmental conditions. For example, if a component has a measured temperature of 70° Fahrenheit and 70% relative humidity, the environmental condition repository (208) may specify that the component has a high rate of corrosion. However, if the component is associated with a corrosion management component, the environmental condition repository (208) may specify a risk reduction factor that may be applied to the corrosion rate (based on environmental conditions) to obtain an estimate of the corrosion rate of the component that takes into account the presence of the corrosion management component.

The corrosion rate repository (210) may include one or more data structures that include information regarding the rates at which components disposed in the chassis have corroded. For example, the corrosion rate repository (210) may include tables associated with different components disposed within the chassis. Each of these tables may include the measured and/or estimated corrosion of the components.

The tables may also include the time at which the corrosion was measured. Consequently, the rates of corrosion of the components may be ascertained using the information included in the tables (e.g., corrosion at time T1–corrosion at time T2/the different between T1 and T2).

The lifecycle repository (212) may include one or more data structures that include information regarding the desired life of components disposed in a chassis of an information handling system. For example, the lifecycle repository (212) may specify how much corrosion may occur with respect to different components before the respective components are likely to fail. The aforementioned information may be used in conjunction with determined corrosion rates and quantities of corrosion included in the corrosion rate repository (210) to determine whether it is likely that a component, computing device, and/or IHS is likely to fail prior to meeting its service life.

While the data structures stored in storage (204) have been described as including a limited amount of specific information, any of the data structures stored in storage (204) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the environmental manager (200) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the environmental component manager (202). Each of these instances may communicate and cooperate to provide the functionality of the environmental component manager (202).

As noted above, the environmental manager (200) may provide environmental services to reduce the impact of corrosion on the operation life of an IHS. FIG. 3 illustrates a method that may be performed by the environmental manager (200) of FIG. 2 when providing environmental management services.

FIG. 3 shows a flowchart of a method in accordance with one or more embodiments of the invention. The method depicted in FIG. 3 may be used to manage the internal environment of a chassis in accordance with one or more embodiments of the invention. The method shown in FIG. 3 may be performed by, for example, an environmental manager (e.g., 200, FIG. 2). Other components of the system illustrated in FIGS. 1.1-2 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, a component subject to corrosion related failure is identified. The component may be identified using information included in a lifecycle repository. For example, the lifecycle repository may include a list of components that are subject to corrosion related failure. Any of these components included in the list may be the identified component.

In step 302, an environmental corrosion risk associated with the component is identified. The environmental corrosion risk may be identified based on detector measurements of the environment in which the component resides. For example, the temperature, relative humidity level, and/or other conditions that may impact corrosion may be monitored using detectors. These environmental conditions may be used as the environmental corrosion risk. Alternatively, the environmental corrosion risk may be measured using corrosion detectors that directly measure the rates of corrosion within the chassis due to the environment of the chassis.

In step 304, it is determined whether the component is associated with a corrosion management component. The determination may be made based on information included in an environmental condition repository (208, FIG. 2). The environmental condition repository may specify each component that is associated with a corrosion management component. The environmental condition repository may also specify correction factors that are associated with the corrosion management component associated with the component.

If it is determined that the component is not associated with any corrosion management components, the method may proceed to step 306. If it is determined that the component is associated with a corrosion management component, the method may proceed to step 308.

In step 306, a corrosion risk of the component is estimated based on the environmental corrosion risk. For example, the environmental corrosion risk may be associated with corresponding levels of corrosion based on a composition of the component. The association may be determined in a laboratory environment and provided (e.g., stored in storage of or otherwise made available to) to an environmental manager.

For example, the corrosion risk of the component may be functionally related to the environmental corrosion risk. The corrosion risk of the component may be computed by providing the environmental corrosion risk as input to the functional relationship.

Returning to step 304, the method may proceed to step 308 following step 304 if it is determined that the component is associated with a corrosion management component.

In step 308, a corrosion risk of the component is estimated based on (i) the environmental corrosion risk and (ii) a risk reduction factor associated with the corrosion management component.

As discussed with respect to step 306, the corrosion risk of the component (e.g., how quickly the component is corroding) may be functionally related to the environmental corrosion risk. To take into account the presence of the corrosion management component, a risk reduction factor (e.g., correction factor) may be applied to the output of the functional relationship to obtain the estimate of the corrosion risk of the component. In other words, the corrosion risk of the component based only on the environmental risk may be first calculated. Then, a risk reduction factor may be applied to obtain the corrosion risk of the component to reflect it being associated (e.g., in direct contact with) with a corrosion management component.

The risk reduction factor may be based on, for example, the type, material composition, shape, method of integration of the corrosion management component with the component, and/or characteristics of the component (e.g., shape, size, etc.). The risk reduction factor may be determined based on laboratory measurement and may be provided to the environmental manager prior to the performance of the method illustrated in FIG. 3.

For example, the risk reduction factor may be proportional to the rate of water removal from a surface of the component by the corrosion management component. The size, shape, and/or other characteristics of the corrosion management components may impact the rate of water removal by the corrosion management component. The rate of water removal and corresponding risk reduction factor may be determined in a laboratory environment prior to use of the corrosion management component.

The method may proceed to step 310 follow step 306 and/or step 308.

In step 310, it is determined whether the corrosion risk of the component indicates a premature failure of the component. The determination may be made by using the corrosion risk of the component to determine whether the component is likely to prematurely fail before the service life of the component is met.

For example, it may be assumed that the rate of corrosion indicated by the corrosion risk of the component will remain constant and the duration of time between the current point in time and the future point in time at which failure is likely to occur may be determined. The future point in time may then be compared to the service life of the component to ascertain whether the rate of corrosion will result in a premature failure that occurs prior to the service life of the component being met. The service life of the component may be specified by a lifecycle repository.

The determination may be made by comparing the amount of corrosion of the component that has occurred and the corrosion rate to a maximum amount of corrosion that can occur before failure of the component is likely (e.g., specified in a lifecycle repository). In other words, solving the equation $C_f = C_c + T^* C_r$ where $C_f$ is the amount of corrosion that can occur before premature failure is likely to occur, $C_c$ is the amount of corrosion that has already occurred, $C_r$ is the corrosion rate determined in steps 306 and/or 308, and T is the unknown amount of time until premature failure will occur due to corrosion. If the amount of time until premature failure indicates that failure of the component will occur before the desired service life of the component occurs, it is determined that the corrosion rates indicates a premature failure of the component will occur.

Additionally, predictive models may be used to further ascertain the likely point in time at which the component is likely to fail due to corrosion. For example, the rates of corrosion over time may be used as training data for a machine learning model, regressive function, or other type of model that may be used to predict the likely future rates of corrosion of the component. These models may then be used to predict the future corrosion of the component (rather than assuming a constant rate of corrosion). The previously measured and predicted future rates of corrosion (and/or absolute amounts of corrosion) may be utilized to determine when the component is likely to fail due to corrosion. Predicted date of failure may then be compared to the service life goal of the component to determine if it will prematurely fail (i.e., if the predicted failure date occurs prior to the service life goal).

If it is determined that the rate of corrosion indicates a premature failure of the component, the method may proceed to step 312. If it is determined that the rate of corrosion does not indicate premature failure of the component, the method may end following step 310.

In step 312, the corrosion risk of the component is remediated. The corrosion risk of the component may be remediated by modifying the environmental conditions within the chassis to reduce corrosion of the component.

For example, the temperature of gases supplied to the chassis may be increased, the rate of gas flow through the chassis may be decreased, humidity may be removed from the gases supplied to the chassis, and/or other changes to the environment may be made.

These changes may be made by modifying operating points of environmental management components.

To modify the operating points of the environmental management components, messages may be sent to the components indicating that changes are to be made, rates of power supplied to the components may be changed (e.g., reduced), and/or other modifications may be made.

The aforementioned changes may be made in a manner that minimizes the consumption of power for such purposes. In other words, reduction in that amount of corrosion due to these changes may be minimized such that the component is likely to meet its service life goal.

The method may end following step 312.

Using the method illustrated in FIG. 3, embodiments of the invention may provide a system that manages conditions within a chassis to limit corrosion to meet service life goals.

The environmental manager (200) of FIG. 2 may be implemented as a distributed computing device. For example, the functionality of the environmental manager may be provided by one or more system environmental managers and chassis environmental managers that cooperatively provide the functionality of the environmental manager (200). As used herein, a distributed computing device refers to functionality provided by a logical device that utilizes the computing resources of one or more separate and/or distinct computing devices.

Figure 4:
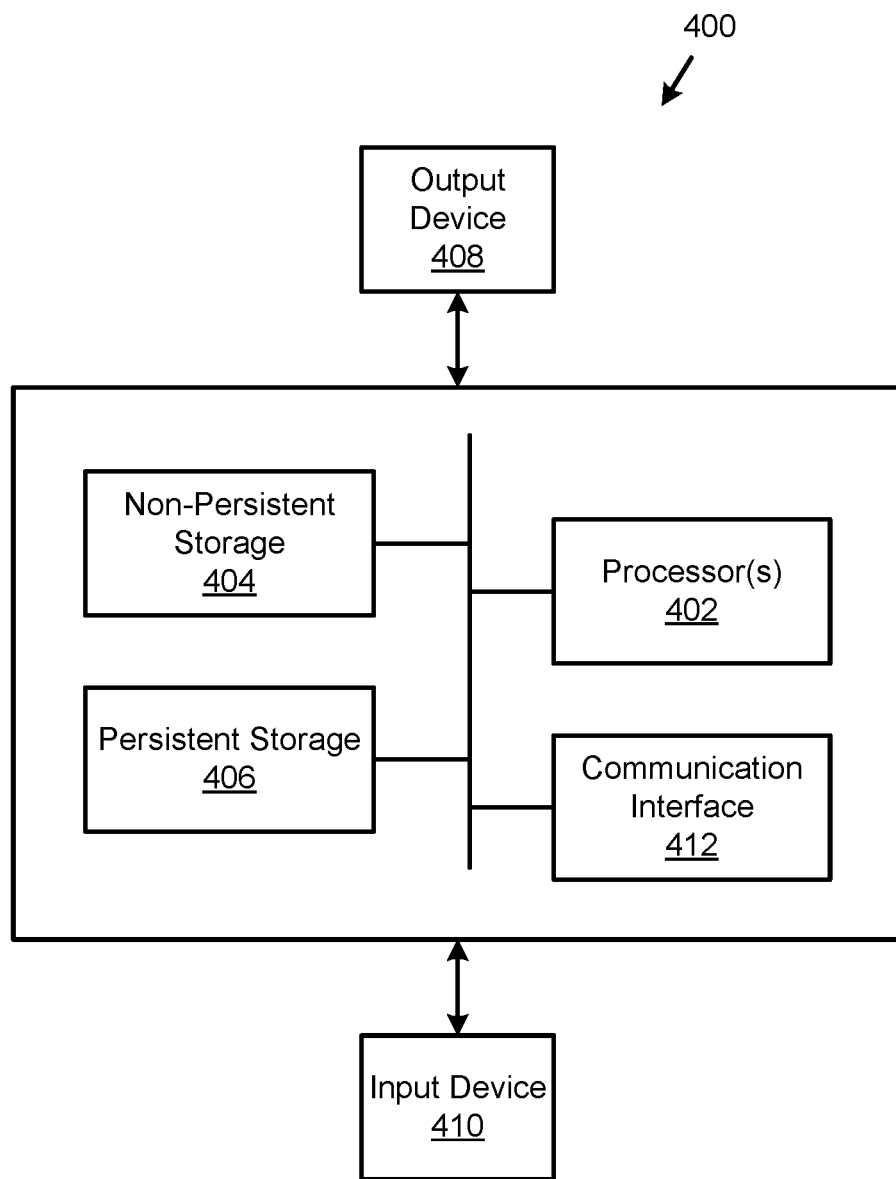
FIG. 4 shows a diagram of a computing device in accordance with one or more embodiments of the invention.

Additionally, as discussed above, embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing components of an information handling system. Specifically, embodiments of the invention may provide a method and device for managing corrosion of components of an IHS. To do so, embodiments of the invention may provide a system that utilizes corrosion management components to remove condensation from corrosion sensitive components. By reducing the amount of condensation on the components, corrosion management components may reduce the rate of corrosions of these components. By doing so, premature failures due to corrosion even in environment conducive to corrosion may be mitigated. Consequently, IHSs in accordance with embodiments of the invention may be able to operate in harsher environments that would otherwise cause IHSs to fail due to corrosion.

Thus, embodiments of the invention may address the problem of environments that may cause premature failures of devices due to corrosion. Specifically, embodiments of the invention may provide a method of managing corrosion that enables less power to be consumed for environmental conditioning purposes while still mitigating the impacts of corrosion.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device of an information handling system, comprising:
   a component that is sensitive to corrosion; and
   a corrosion management component, directly disposed on a surface of the component, adapted to evaporate condensation associated with the component.

2. The computing device of claim 1, wherein the corrosion management component comprises:
   a portion that transfers condensation from the surface of the component to an evaporative surface of the corrosion management component that evaporates the condensation.

3. The computing device of claim 2, wherein the portion comprises a plurality of capillaries through a support material.

4. The computing device of claim 3, wherein the capillaries are adapted to transfer the condensation through capillary action.

5. The computing device of claim 1, wherein the corrosion management component comprises an open cell foam.

6. The computing device of claim 5, wherein the open cell foam is a metal foam.

7. The computing device of claim 5, wherein a structure of the open cell foam is adapted to absorb condensed water from the surface of the component.

8. The computing device of claim 1, further comprises:
   a chassis adapted to direct an airflow proximate to the component to manage a thermal state of the component.

9. The computing device of claim 8, wherein the airflow comprises water vapor that condenses to form the condensation.

10. The computing device of claim 1, further comprising:
    an environmental manager programmed to:
      monitor an environmental corrosion risk associated with the component;
      make a determination that the component is associated with the corrosion management component;
      in response to the determination:
        estimate a corrosion risk of the component based on:
          the environmental corrosion risk, and
          a risk reduction factor associated with the corrosion management component;
        make a second determination that the corrosion risk of the component indicates a premature failure of the component; and
        remediate, in response to the second determination, the corrosion risk of the component.

11. The computing device of claim 10, wherein remediating the corrosion risk of the component comprises:
    performing an action set comprising at least one selected from the group consisting of:
      increasing a temperature of the component;
      decreasing a humidity level of an atmosphere proximate to the component; and
      reducing a rate of flow of the atmosphere proximate to the component.

12. The computing device of claim 10, wherein the environmental manager is further programmed to:
    monitor a second environmental corrosion risk associated with a second component;
    make a third determination that the second component is not associated with any corrosion management components;
    in response to the third determination:
      estimate a second corrosion risk of the second component based on:
        the second environmental corrosion risk, and
        no risk reduction factors associated with any corrosion management components;
      make a fourth determination that the second corrosion risk of the second component indicates a second premature failure of the second component; and
      remediate, in response to the fourth determination, the second corrosion risk of the second component.

13. The computing device of claim 10, wherein the environmental corrosion risk is estimated based on a temperature of the component and a relative humidity level of an atmosphere proximate to the component.

14. The computing device of claim 10, wherein the environmental corrosion risk is estimated based on a corrosion rate measured by a corrosion detector.

15. The computing device of claim 10, wherein the risk reduction factor specifies a reduction in the rate of corrosion of the component based on a rate of condensation removal provided by the corrosion management component.

16. A method for environmentally managing a computing device of an information handling system, comprising:
  monitoring an environmental corrosion risk associated with a component of the computing device, wherein a corrosion management component adapted to reduce a rate of corrosion of the component due to an ambient environment in which the component resides by removing condensation from the component is associated with the component;
  making a determination that the component is associated with the corrosion management component;
  in response to the determination:
    estimating a corrosion risk of the component based on:
      the environmental corrosion risk, and
      a risk reduction factor associated with the corrosion management component;
    making a second determination that the corrosion risk of the component indicates a premature failure of the component; and
    remediating, in response to the second determination, the corrosion risk of the component.

17. The method of claim 16, wherein remediating the corrosion risk of the component comprises:
  performing an action set comprising at least one selected from the group consisting of:
    increasing a temperature of the component;
    decreasing a humidity level of an atmosphere proximate to the component; and
    reducing a rate of flow of the atmosphere proximate to the component.

18. The method of claim 16, further comprising:
  monitoring a second environmental corrosion risk associated with a second component, wherein the second component is associated with any corrosion management components;
  making a third determination that the second component is not associated with any corrosion management components;
  in response to the third determination:
    estimating a second corrosion risk of the second component based on:
      the second environmental corrosion risk, and
      no risk reduction factors associated with any corrosion management components;
    making a fourth determination that the second corrosion risk of the second component indicates a second premature failure of the second component; and
    remediating, based on the fourth determination, the second corrosion risk of the second component.

19. A non-transitory computer readable medium comprising computer readable program code, which when executed by a computer processor enables the computer processor to perform a method for environmentally managing a computing device of an information handling system, the method comprising:
  monitoring an environmental corrosion risk associated with a component of the computing device, wherein a corrosion management component adapted to reduce a rate of corrosion of the component due to an ambient environment in which the component resides by removing condensation from the component is associated with the component;
  making a determination that the component is associated with the corrosion management component;
  in response to the determination:
    estimating a corrosion risk of the component based on:
      the environmental corrosion risk, and
      a risk reduction factor associated with the corrosion management component;
    making a second determination that the corrosion risk of the component indicates a premature failure of the component; and
    remediating, in response to the second determination, the corrosion risk of the component.

20. The non-transitory computer readable medium of claim 19, wherein remediating the corrosion risk of the component comprises:
  performing an action set comprising at least one selected from the group consisting of:
    increasing a temperature of the component;
    decreasing a humidity level of an atmosphere proximate to the component; and
    reducing a rate of flow of the atmosphere proximate to the component.

* * * * *